US012198463B2

(12) United States Patent
Liu et al.

(10) Patent No.: US 12,198,463 B2
(45) Date of Patent: Jan. 14, 2025

(54) FINGERPRINT IDENTIFICATION MODULE

(71) Applicants: Beijing BOE Optoelectronics Technology Co., Ltd., Beijing (CN); BOE Technology Group Co., Ltd., Beijing (CN)

(72) Inventors: Xin Liu, Beijing (CN); Chen Meng, Beijing (CN); Jiaqiang Wang, Beijing (CN); Ziyan Li, Beijing (CN)

(73) Assignees: Beijing BOE Optoelectronics Technology Co., Ltd., Beijing (CN); BOE Technology Group Co. Ltd., Beijing (CN)

( * ) Notice: Subject to any disclaimer, the term of this patent is extended or adjusted under 35 U.S.C. 154(b) by 0 days.

(21) Appl. No.: 18/016,905

(22) PCT Filed: Feb. 23, 2022

(86) PCT No.: PCT/CN2022/077525
§ 371 (c)(1),
(2) Date: Jan. 19, 2023

(87) PCT Pub. No.: WO2023/159402
PCT Pub. Date: Aug. 31, 2023

(65) Prior Publication Data
US 2024/0249550 A1 Jul. 25, 2024

(51) Int. Cl.
*G06V 40/13* (2022.01)
*H05K 5/00* (2006.01)
(52) U.S. Cl.
CPC ....... *G06V 40/1318* (2022.01); *H05K 5/0017* (2013.01); *H05K 5/0026* (2013.01)

(58) Field of Classification Search
CPC .. G06V 40/1318; G06V 40/13; H05K 5/0017; H05K 5/0026; G06F 18/00
See application file for complete search history.

(56) References Cited

U.S. PATENT DOCUMENTS

2017/0024599 A1* 1/2017 Lai ................. G06V 10/141
2017/0147848 A1 5/2017 Lin et al.
(Continued)

FOREIGN PATENT DOCUMENTS

CN 105426873 A 3/2016
CN 206193837 U 5/2017
(Continued)

*Primary Examiner* — Jonathan A Boyd
(74) *Attorney, Agent, or Firm* — ArentFox Schiff LLP; Michael Fainberg

(57) ABSTRACT

A fingerprint identification module provided by the present disclosure includes a fingerprint identification panel provided with a fingerprint identification region; a middle shell including a partition plate and a middle frame, where the partition plate is at a side opposite a fingerprint identification side of the fingerprint identification panel, the partition plate is detachably connected to the middle frame, and the middle frame includes an accommodation space, the accommodation space being internally provided with the partition plate and the fingerprint identification panel; and a main board in the accommodation space, the main board being at a side, far away from the fingerprint identification panel, of the partition plate, and the main board being electrically connected to the fingerprint identification panel.

18 Claims, 9 Drawing Sheets

(56) References Cited

U.S. PATENT DOCUMENTS

2019/0026525 A1    1/2019  Long
2021/0157198 A1*  5/2021  Hu ........................ H04M 1/026

FOREIGN PATENT DOCUMENTS

| | | | | |
|---|---|---|---|---|
| CN | 207022063 | * | 8/2017 | .............. H04M 1/02 |
| CN | 107426367 A | | 12/2017 | |
| CN | 206931604 U | | 1/2018 | |
| CN | 207022063 U | | 2/2018 | |
| CN | 207650701 U | | 7/2018 | |
| CN | 108496179 A | | 9/2018 | |
| CN | 109670375 A | | 4/2019 | |
| CN | 109716351 A | | 5/2019 | |
| CN | 114241532 A | | 3/2022 | |
| WO | 2021114289 A1 | | 6/2021 | |

* cited by examiner

FINGERPRINT IDENTIFICATION MODULE

CROSS-REFERENCE OF RELATED APPLICATIONS

The present application is a national phase entry under 35 U.S.C. § 371 of International Application No. PCT/CN2022/077525, filed on Feb. 23, 2022.

FIELD

The present disclosure relates to the technical field of fingerprint identification, in particular to a fingerprint identification module.

BACKGROUND

Fingerprint identification technology, a kind of biometric identification technology, can be used for personal identification by comparing detail feature points of different fingerprints. The fingerprint identification technology features fast identification, convenient fingerprint collection, and low cost, thereby being widely applied to the identity authentication fields of safeguard, bank payment, public security, mobile phones and computers, etc.

SUMMARY

The present disclosure provides a fingerprint identification module. The specific solution is as follows.

A fingerprint identification module according to embodiments of the present disclosure includes:
- a fingerprint identification panel including a fingerprint identification region;
- a middle shell including a partition plate and a middle frame, where the partition plate is positioned at a side opposite a fingerprint identification side of the fingerprint identification panel, the partition plate is detachably connected to the middle frame, and the middle frame includes an accommodation space, the accommodation space being internally provided with the partition plate and the fingerprint identification panel; and
- a main board positioned in the accommodation space, the main board being positioned at a side, far away from the fingerprint identification panel, of the partition plate, and the main board being electrically connected to the fingerprint identification panel.

In some embodiments, the fingerprint identification module according to the embodiments of the present disclosure further includes first connector(s). The partition plate includes first via hole(s), the main board includes second via hole(s), and the fingerprint identification panel includes first connection post(s), the first connection post(s) being positioned at a side, facing the partition plate, of the fingerprint identification panel, the first connection post(s) including first blind hole(s), and the first connection post(s) passing through the first via hole(s). The first connector(s) is/are embedded in the first blind hole(s) through the second via hole(s).

In some embodiments, in the fingerprint identification module according to the embodiments of the present disclosure, the fingerprint identification panel further includes frame regions encircling the fingerprint identification region, the plurality of first connection posts are arranged, and the first connection posts are dispersedly arranged in the frame regions.

In some embodiments, in the fingerprint identification module according to the embodiments of the present disclosure, the middle frame includes a plurality of side walls and a plurality of flanges. The side walls are arranged at a side, facing the fingerprint identification panel, of the partition plate, are arranged on the periphery of the partition plate, and extend in a direction perpendicular to a surface of the partition plate. The number of the side walls matches the number of edges of the partition plate. The side walls are connected end to end successively in a direction parallel to the surface of the partition plate to form the accommodation space. Each flange is detachably connected to the partition plate. The flange extends from an end face, adjacent to the fingerprint identification panel, of the side wall to the accommodation space, and an orthographic projection, on the fingerprint identification panel, of each flange does not overlap the fingerprint identification region.

In some embodiments, in the fingerprint identification module according to the embodiments of the present disclosure, the edge of the partition plate includes a first recess, the first recess being recessed in a direction far away from the edge of the partition plate in a direction parallel to the surface of the partition plate. The flange includes a second recess, the second recess being recessed toward the side wall in the direction parallel to the surface of the partition plate. The first recess and the second recess are provided in a through manner in a stacking direction of the partition plate and the flange. The fingerprint identification panel is electrically connected to the main board by means of the first recess and the second recess that are provided in a through manner.

In some embodiments, in the fingerprint identification module according to the embodiments of the present disclosure, the fingerprint identification panel includes a backlight module, a fingerprint identification substrate and a drive circuit. The drive circuit is connected to the backlight module and the main board as well as the fingerprint identification substrate and the main board by means of the first recess and the second recess that are provided in a through manner. The backlight module is positioned between the fingerprint identification substrate and the partition plate in the direction perpendicular to the surface of the partition plate.

In some embodiments, the fingerprint identification module according to the embodiments of the present disclosure further includes second connectors. The flange includes second blind holes, the second blind holes being positioned at two edges in an extension direction of the flange. The partition plate includes third via holes directly facing the second blind holes, and the second connector is embedded in the second blind hole through the third via hole.

In some embodiments, in the fingerprint identification module according to the embodiments of the present disclosure, the main board further includes a universal serial bus (USB) interface, a switch and a power socket that are arranged on the same side, the switch being arranged adjacent to the power socket.

In some embodiments, in the fingerprint identification module according to the embodiments of the present disclosure, the side wall adjacent to the USB interface, the switch and the power socket is provided with a first opening and a second opening, the first opening exposing the USB interface and the second opening exposing the switch and the power socket.

In some embodiments, the fingerprint identification module according to the embodiments of the present disclosure further includes a front cover. The front cover is positioned at a side, adjacent to the fingerprint identification panel, of the middle frame. The front cover is fixedly connected to the middle frame. The front cover includes a third opening, and an orthographic projection, on the fingerprint identification panel, of the third opening substantially coincides with the fingerprint identification region.

In some embodiments, the fingerprint identification module according to the embodiments of the present disclosure further includes third connectors. The flange adjacent to a first flexible printed circuit board includes fourth via holes, the fourth via holes being positioned at two edges in the extension direction of the flange. The front cover includes second connection posts. The second connection post is positioned at a side, facing the flange, of the front cover. The second connection post includes a third blind hole. The second connection post is embedded in the fourth via hole, and the third connector is embedded in the third blind hole.

In some embodiments, the fingerprint identification module according to the embodiments of the present disclosure further includes an ambient light sensing element. The ambient light sensing element is arranged at a side, far away from the partition plate, of the flange.

The front cover further includes a fourth opening. An orthographic projection, on the fingerprint identification panel, of the fourth opening is positioned in the orthographic projection, on the fingerprint identification panel, of the flange, and the fourth opening exposes the ambient light sensing element.

In some embodiments, the fingerprint identification module according to the embodiments of the present disclosure further includes an ambient light protective film. The ambient light protective film seals the fourth opening, and the ambient light protective film includes a transparent region, the transparent region being positioned at the fourth opening.

In some embodiments, in fingerprint identification module according to the embodiments of the present disclosure, the ambient light protective film further includes a shading region, the shading region encircling the transparent region.

In some embodiments, the fingerprint identification module according to the embodiments of the present disclosure further includes a rear shell. The rear shell is positioned at a side, adjacent to the main board, of the middle frame, and the rear shell is fixedly connected to the middle frame.

In some embodiments, in the fingerprint identification module according to the embodiments of the present disclosure, the middle frame further includes a plurality of protrusions. The protrusion extends from the side wall to the accommodation space, the protrusion is arranged adjacent to a corner of the accommodation space, an orthographic projection, on the fingerprint identification panel, of the protrusion does not overlap the fingerprint identification region, and the protrusion is fixedly connected to the rear shell.

In some embodiments, the fingerprint identification module according to the embodiments of the present disclosure further includes fourth connectors. The protrusion includes a fourth blind hole, the rear shell includes fifth via holes, and the fourth connector is embedded in the fourth blind hole through the fifth via hole.

In another aspect, embodiments of the present disclosure further provide an assembly method for the fingerprint identification module. The assembly method for the fingerprint identification module includes:

providing a fingerprint identification panel, a middle shell and a main board, where the middle shell includes a partition plate and a middle frame that are designed separate, and the middle frame includes an accommodation space;

superposing the fingerprint identification panel and the main board on opposite sides of the partition plate, and causing the fingerprint identification panel and the main body to be capable of moving relative to the partition plate by fixedly connecting the fingerprint identification panel to the main board; and placing the partition plate, the fingerprint identification panel and the main board in the accommodation space, and fixing the partition plate on the middle frame.

In some embodiments, in the above assembly method according to the embodiments of the present disclosure, the superposing the fingerprint identification panel and the main board on opposite sides of the partition plate, and causing the fingerprint identification panel and the main body to be capable of moving relative to the partition plate by fixedly connecting the fingerprint identification panel to the main board specifically include:

making a first connection post of the fingerprint identification panel penetrate a first via hole of the partition plate; and making a first connector penetrate a second via hole of the main board to be embedded in a first blind hole of the first connection post, fixedly connecting the fingerprint identification panel to the main board, and causing the fingerprint identification panel and the main body to be capable of moving relative to the partition plate.

In some embodiments, in the above assembly method according to the embodiments of the present disclosure, the middle frame includes a plurality of side walls and a plurality of flanges, the side walls are connected end to end successively to form the accommodation space, the flange extends from an end face, adjacent to the fingerprint identification panel, of the side wall to the accommodation space, and after fixing the partition plate on the middle frame, the assembly method further includes:

providing a front cover, and inserting a second connection post of the front cover into a fourth via hole of the flange; and embedding a third connector in a third blind hole of the second connection post, locking the front cover and the flange together, and fastening the fingerprint identification panel and the main board on the opposite sides of the partition plate.

In some embodiments, in the above assembly method according to the embodiments of the present disclosure, after the embedding a third connector in a third blind hole of the second connection post, locking the front cover and the flange together, and fastening the fingerprint identification panel and the main board on the opposite sides of the partition plate, the assembly method further includes:

providing a rear shell, and making a fourth connector penetrate a fifth via hole of the rear shell to be embedded in a fourth blind hole in a protrusion provided in the middle frame, and fastening the rear shell on the middle frame.

In some embodiments, in the fingerprint identification module according to the embodiments of the present disclosure, the fingerprint identification panel further includes the frame regions encircling the fingerprint identification region, the frame regions include a first frame region and a second frame region that are opposite each other, and a third frame region and a fourth frame region that are connected to the first frame region and the second frame region respectively.

The drive circuit includes a chip on film, first flexible printed circuit boards and a second flexible printed circuit board.

The chip on film is positioned in the first frame region, the chip on film is folded toward the main board from a side, far away from the backlight module, of the fingerprint identification substrate, and the chip on film is connected to the fingerprint identification substrate and the main board.

The first flexible printed circuit boards are positioned in the third frame region and the fourth frame region, the first flexible printed circuit board is folded toward the main board from the side, far away from the backlight module, of the fingerprint identification substrate, and the first flexible printed circuit board is connected to the fingerprint identification substrate and the main board.

The second flexible printed circuit board is positioned in the second frame region, the second flexible printed circuit board is folded toward the main board from a side, facing the fingerprint identification substrate, of the backlight module, and the second flexible printed circuit board is connected to the backlight module and the fingerprint identification substrate.

DETAILED DESCRIPTION OF THE EMBODIMENTS

Figure 1:
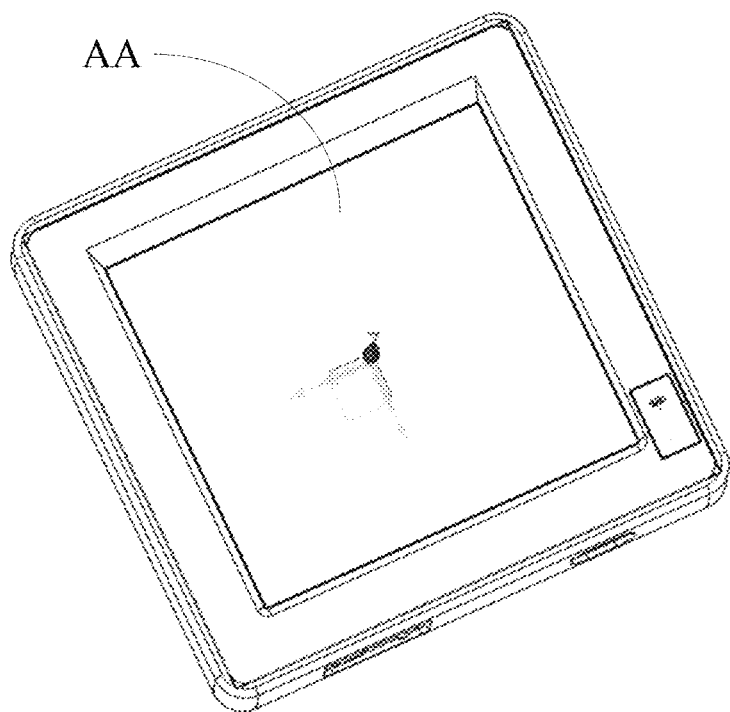
FIG. 1 is a schematic front diagram of a fingerprint identification module according to an embodiment of the present disclosure.

In order to make objectives, technical solutions and advantages of embodiments of the present disclosure clearer, the technical solutions of the embodiments of the present disclosure will be clearly and completely described with reference to accompanying drawings of the embodiments of the present disclosure. It should be noted that a size and a shape of each figure in the accompanying drawings do not reflect true scales, and are merely to illustrate contents of the present disclosure. Throughout the accompanying drawings, identical or similar reference numerals denote identical or similar elements or elements having identical or similar functions.

Unless otherwise defined, technical terms or scientific terms used herein should have ordinary meanings understood by those of ordinary skills in the field to which the present disclosure belongs. Words such as "first" and "second" used in the description of the present disclosure and the claims do not denote any order, quantity, or importance, but are merely used to distinguish between different components. Words such as "include" or "encompass" are intended to mean that an element or item in front of the word encompasses elements or items that are present behind the word and equivalents thereof, but does not exclude other elements or items. Words such as "inside", "outside", "up" and "down" are merely used to express the relative positional relation. When the absolute position of a described object changes, the relative positional relation may also change accordingly.

At present, payment or information input are confirmed by fingerprint information comparison in many cases, but current fingerprint identification mostly involves collection and comparison of single-finger fingerprint information and generates misidentification of different degrees, thereby reducing security of information confirmation. Multi-finger fingerprinting technology greatly improves security of information comparison, and is especially suitable for scenes with extremely high security requirements for identification. Compared with a single-finger fingerprint identification region (usually 20 mm*30 mm), expansion of a multi-finger (four-finger, for example) fingerprint identification region (usually 80 mm*80 mm) will increase a size of a fingerprint identification panel and a size of a main board, thus increasing difficulty in assembly of the fingerprint identification panel and main board to a middle frame. And, disassembly is difficult, and maintenance is not facilitated.

In order to solve the above technical problems existing in related technologies, as shown in FIGS. 1-10, a fingerprint identification module is provided according to embodiments of the present disclosure, which includes:

a fingerprint identification panel 001 including a fingerprint identification region AA;

a middle shell 002 including a partition plate 201 and a middle frame 202, where the partition plate 201 is positioned at a side opposite a fingerprint identification side of the fingerprint identification panel 001, and the middle frame 202 includes an accommodation space 2021, the accommodation space 2021 being internally provided with the partition plate 201 and the fingerprint identification panel 001; and a main board 003 positioned in the accommodation space 2021, the main board 003 being positioned at a side, facing away from the fingerprint identification panel 001, of the partition plate 201, and the main board 003 being electrically connected to the fingerprint identification panel 001.

In the fingerprint identification module according to the embodiments of the present disclosure, the middle shell 002 uses separated design, i.e., the middle shell 002 is split into the detachable partition plate 201 and middle frame 202, such that after the main board 003 and the fingerprint identification panel 001 are arranged on opposite sides of the partition plate 201, the main board 003, the fingerprint identification panel 001 and the partition plate 201 are fixed on the middle frame 202 as a whole, thereby reducing assembly difficulty, improving convenience and efficiency of overall assembly, and facilitating disassembly and maintenance.

Figure 4:
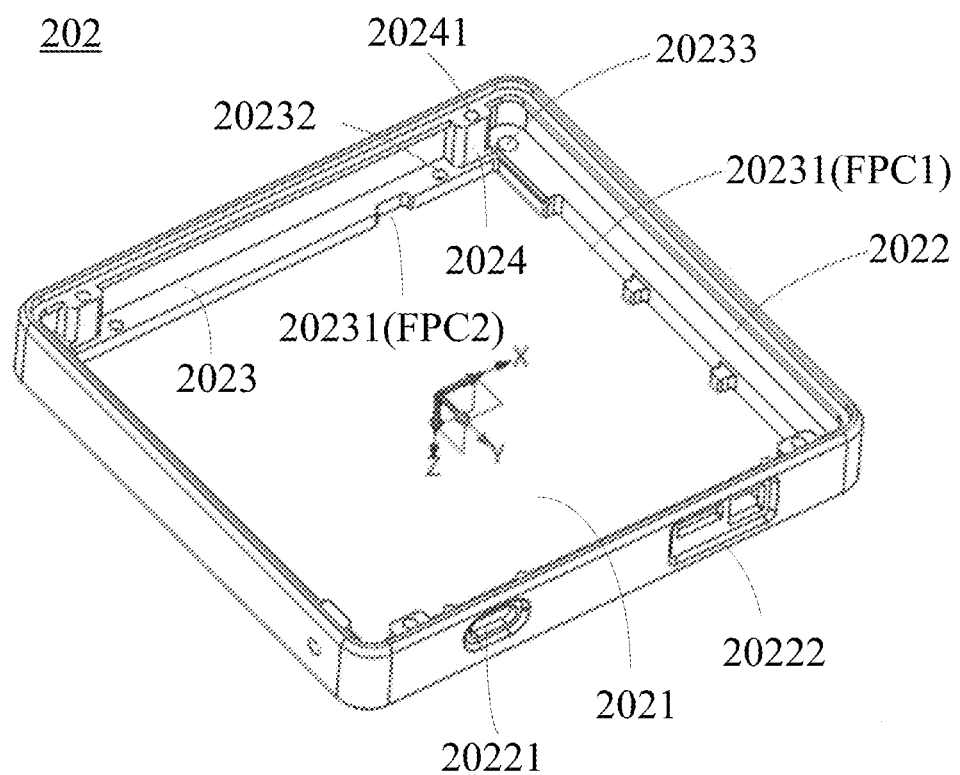
FIG. 4 is a schematic structural diagram of a middle frame according to an embodiment of the present disclosure.
Figure 5:
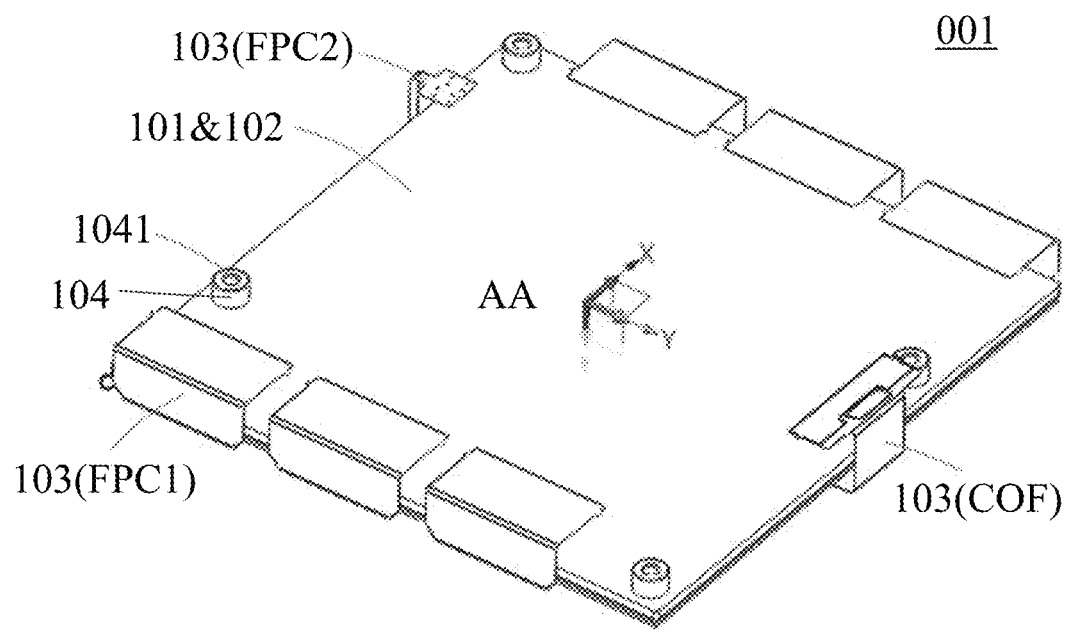
FIG. 5 is a schematic structural diagram of a fingerprint identification panel according to an embodiment of the present disclosure.

In some embodiments, in the fingerprint identification module according to the embodiments of the present disclosure, as shown in FIG. 4, the middle frame 202 includes a plurality of side walls 2022 and a plurality of flanges 2023. The side walls 2022 are arranged at a side, facing the fingerprint identification panel 001, of the partition plate 201, are arranged on the periphery of the partition plate 201, and extend in a direction perpendicular to a surface of the partition plate 201. The number of the side walls 2022 matches the number of edges of the partition plate 201. For example, the partition plate 201 includes four edges, the number of the side walls 2022 is four accordingly. The side walls 2022 are connected end to end successively in a direction parallel to the surface of the partition plate 201 to form the accommodation space 2021. Each flange 2023 is detachably connected to the partition plate 201. The flange 2023 extends from an end face, adjacent to the fingerprint identification panel 001, of the side wall 2022 toward the accommodation space 2021. An orthographic projection, on the fingerprint identification panel 001, of each flange 2023 does not overlap the fingerprint identification region AA.

In some embodiments, in the fingerprint identification module according to the embodiments of the present disclosure, as shown in FIGS. 5-8, the fingerprint identification panel 001 includes a backlight module 101, a fingerprint identification substrate 102 and a drive circuit 103. The backlight module 101 is positioned between the fingerprint identification substrate 102 and the partition plate 201. The drive circuit 103 is folded toward the main board 003 through side surfaces of the fingerprint identification panel 001 and the partition plate 201. The drive circuit 103 is connected to the backlight module 101 and the main board 003 as well as the fingerprint identification panel 102 and the main board 003 separately. Optionally, the backlight module 101 may be composed of a plurality of light-emitting elements (such as light emitting diodes (LED)). The fingerprint identification substrate 102 may include a plurality of photosensitive elements (e.g., photodiodes PIN). The drive circuit 103 may include a chip on film COF led out of the fingerprint identification substrate 102, a first flexible printed circuit board FPC1 led out of the fingerprint identification substrate 102, and a second flexible printed circuit board FPC2 led out of the backlight module 101. The chip on film COF, the first flexible printed circuit board FPC1, and the second flexible printed circuit board FPC2 need to be inserted into corresponding sockets 301 on the main board 003, so as to electrically connect the backlight module 101 to the main board and electrically connect the fingerprint identification substrate 102 to the main board 003 respectively.

Figure 6:
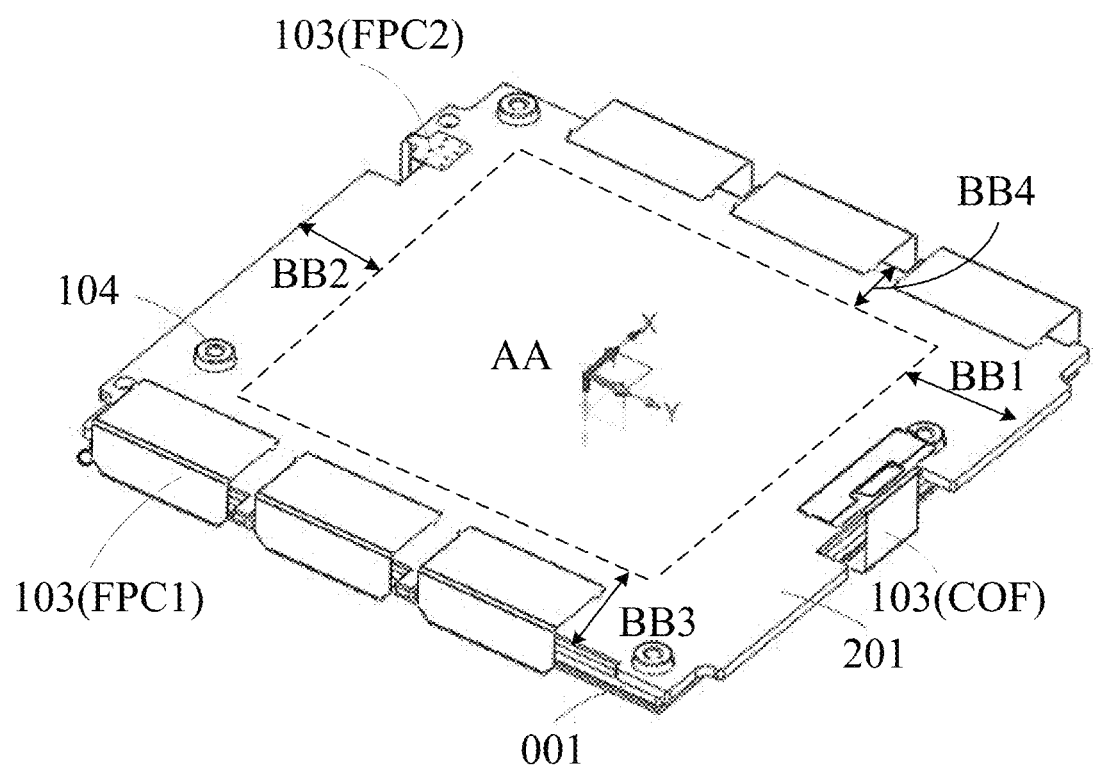
FIG. 6 is a schematic assembly diagram of a partition plate and a fingerprint identification panel according to an embodiment of the present disclosure.

Optionally, as shown in FIG. 6, the fingerprint identification panel 001 may further include frame regions BB encircling the fingerprint identification region. The frame regions BB include a first frame region BB1 and a second frame region BB2 that are opposite each other, and a third frame region BB3 and a fourth frame region BB4 that are connected to the first frame region BB1 and the second frame region BB2 respectively. The chip on film COF is positioned in the first frame region BB1, and the chip on film COF is folded toward the main board 003 from a side, facing away from the backlight module 101, of the fingerprint identification substrate 102. The first flexible printed circuit boards FPC1 are positioned in the third frame region BB3 and the fourth frame region BB4, and the first flexible printed circuit board FPC1 is folded toward the main board 003 from the side, facing away from the backlight module 101, of the fingerprint identification substrate 102. The second flexible printed circuit board FPC2 is positioned in the second frame region BB2, and the second flexible printed circuit board FPC2 is folded toward the main board 003 from a side, facing the fingerprint identification substrate 102, of the backlight module 101.

In related technologies, the fingerprint identification panel 001 mostly uses prism optics technology, resulting in that the fingerprint identification module is great in size and weight and inconvenient to carry. However, the fingerprint identification panel 001 in the present disclosure is equipped with the light-emitting element and the light-sensing element, and does not need other prism devices, thereby having a simple structure, effectively reducing the size and the weight of the fingerprint identification module, and being portable.

In some embodiments, in the fingerprint identification module according to the embodiments of the present disclosure, as shown in FIGS. 3-9, the edge of the partition plate 201 includes a first recess 2011. The first recess 2011 is recessed in a direction far away from the edge of the partition plate 201 in a direction parallel to the surface of the partition plate 201. That is, the first recess 2011 is recessed internally toward a central region of the partition plate 201. The flange 2023 includes a second recess 20231. The second recess 20231 is recessed toward the side wall 2022 in the direction parallel to the surface of the partition plate 201. The first recess 2011 and the second recess 20231 are arranged in a through manner in a stacking direction of the partition plate 201 and the flange 2023. The drive circuit 103 is electrically connected to the main board 003 by means of the first recess 2011 and the second recess 20231 that are arranged in a through manner, thereby making an internal structure of the fingerprint identification module more compact and reducing a size of the frame and the size of the fingerprint identification module. Detachable arrangement of the partition plate 201 and the middle frame 202 facilitates insertion and removal of the drive circuit 103. The first recess 2011 and the second recess 20231 may further protect the drive circuit 103 (such as COF, FPC1 and FPC2) from being pressed by the main board 003 and the partition plate 201 in an assembly process. Optionally, the first recess 2011 and the second recess 20231 may be strip-shaped. In an extension direction of the first recess 2011 and the second recess 20231, a length of the first recess 2011 and a length of the second recess 20231 are slightly longer than a width of a corresponding drive circuit 103 (such as COF, FPC1 and FPC2). In a direction perpendicular to the extension direction of the first recess 2011 and the second recess 20231, a width of the first recess 2011 and a width of the second recess 20231 may be 2 mm to 5 mm, for example, 2 mm, 3 mm, 4 mm and 5 mm.

In some embodiments, as shown in FIG. 3 and FIGS. 5-8, the fingerprint identification module according to the embodiments of the present disclosure further includes first connectors 004. The partition plate 201 includes first via holes 2012, the main board 003 includes second via holes 302, and the fingerprint identification panel 001 includes first connection posts 104. The first connection posts 104 are positioned at a side, facing the partition plate 201, of the fingerprint identification panel 001. The first connection post 104 includes a first blind hole 1041. The first connection post 104 passes through the first via hole 2012. The first connector 004 is embedded in the first blind hole 1041 through the second via hole 302. During implementations, the first connector 004 may be screwed into the first blind hole 1041 through the second via hole 302 on the main board 003, such that the fingerprint identification panel 001 and the main board 003 may be fixed together. In this case, the first connection post 104 may still move relative to the first via hole 2012 in the partition plate 201 (that is, a whole composed of the fingerprint identification panel 001 and the main board 003 may move up and down relative to the partition plate 201). In-plane displacement between the fingerprint identification panel 001 and the partition plate 201 can be prevented, and further relative displacement between the main board 003 and the fingerprint identification panel 001 can also be prevented. Optionally, the first connector 004 may be fixing components such as bolts and screws, which are not limited herein.

In some embodiments, in the fingerprint identification module according to the embodiments of the present disclosure, as shown in FIG. 3 and FIGS. 5-8, a plurality of first connection posts 104 may be arranged, and the first connection posts 104 are dispersed in the frame region BB (for example, at each corner of the fingerprint identification panel 001), so as to well support and fix the main board 003. In addition, each first connection post 104 needs to avoid components such as the chip on film COF, the first flexible printed circuit board FPC1, and the second flexible printed circuit board FPC2, such that each first connection post 104 is arranged independent of the chip on film COF, the first flexible printed circuit board FPC1, and the second flexible printed circuit board FPC2. It is certain that during implementations, a position of the first connection posts 104 may be flexibly set according to actual requirements. On the premise that the first connection posts 104 avoid the components on the main board 003, the position and gaps of the first connection posts 104 are not strictly required. Furthermore, it should be understood that the first connection post 104 may protrude from a plane of the partition plate 201 after penetrating the first via hole 2012, so as to prevent the main board 003 from directly contacting with the partition plate 201 and damaging the main board 003. In other words, in order to protect the main board 003 from damage, a height of the first connection post 104 is required to prevent the main board 003 and components on the main board 003 from making contact with the partition plate 201 after assembly.

Figure 3:
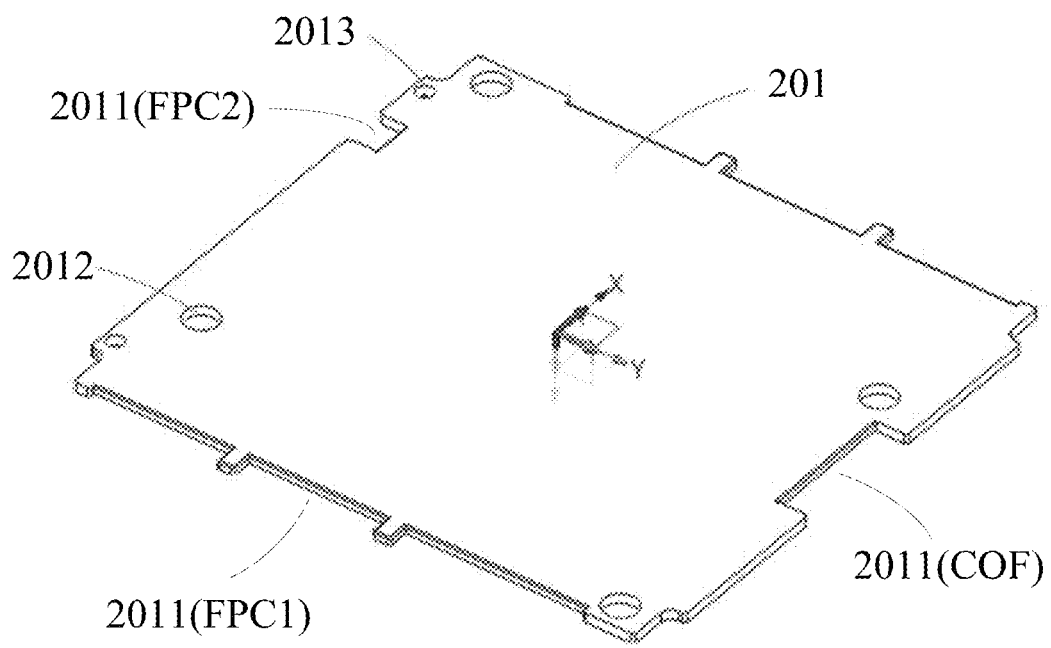
FIG. 3 is a schematic structural diagram of a partition plate according to an embodiment of the present disclosure.
Figure 9:
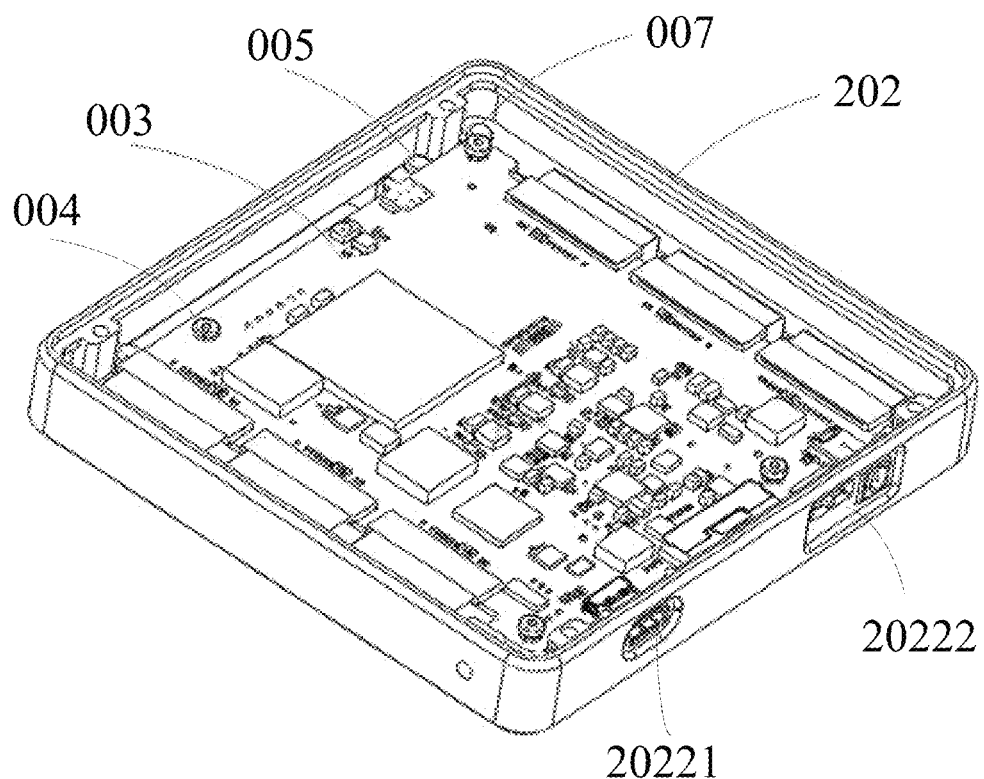
FIG. 9 is a schematic back diagram after assembly of a middle frame, a partition plate, a fingerprint identification panel and a main board according to an embodiment of the present disclosure.
Figure 10:
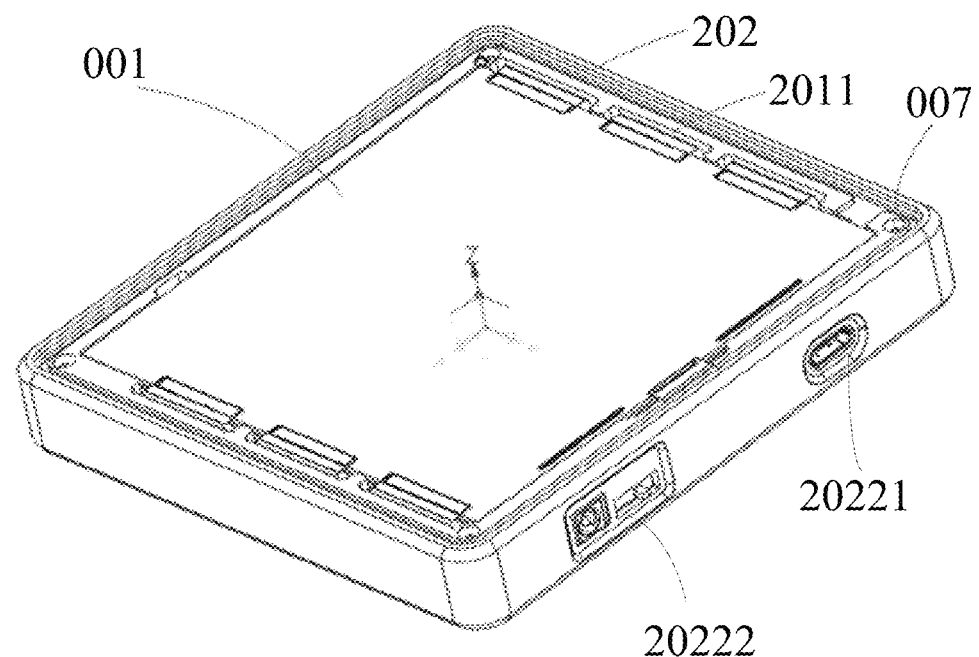
FIG. 10 is a schematic front diagram after assembly of a middle frame, a partition plate, a fingerprint identification panel and a main board according to an embodiment of the present disclosure.

In some embodiments, as shown in FIGS. 3, 4 and 9, the fingerprint identification module according to the embodiments of the present disclosure further includes second connectors 005. At least partial flanges 2023 (for example, flanges adjacent to the chip on film COF and the second flexible printed circuit board FPC2) includes second blind holes 20232. The second blind holes 20232 are positioned at two edges (or called two ends) in an extension direction of the flange 2023. The partition plate 201 includes third via holes 2013 directly facing the second blind holes 20232. The second connector 005 is embedded in the second blind hole 20232 through the third via hole 2013, such that the partition plate 201 is fixed on the flange 2023 of the middle frame 202 by means of the second connector 005. In addition, since the flange 2023 is provided with the blind hole, the phenomenon that beauty is affected due to appearance of the second connector 005 on a front (i.e., the side used for fingerprint identification) of the fingerprint identification module is avoided, and the fingerprint identification module is pressure-resistant and use safety of the fingerprint identification module is guaranteed. Optionally, the second connector 005 may be fixing components such as bolts and screws, which are not limited herein.

Figure 7:
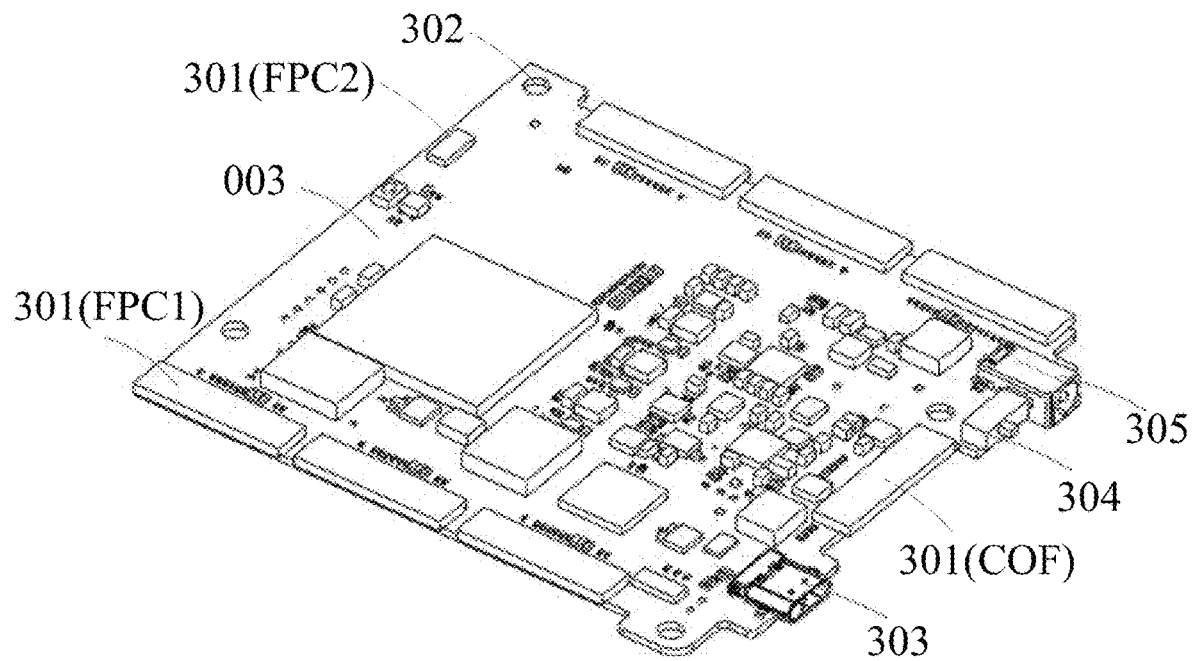
FIG. 7 is a schematic structural diagram of a main board according to an embodiment of the present disclosure.
Figure 8:
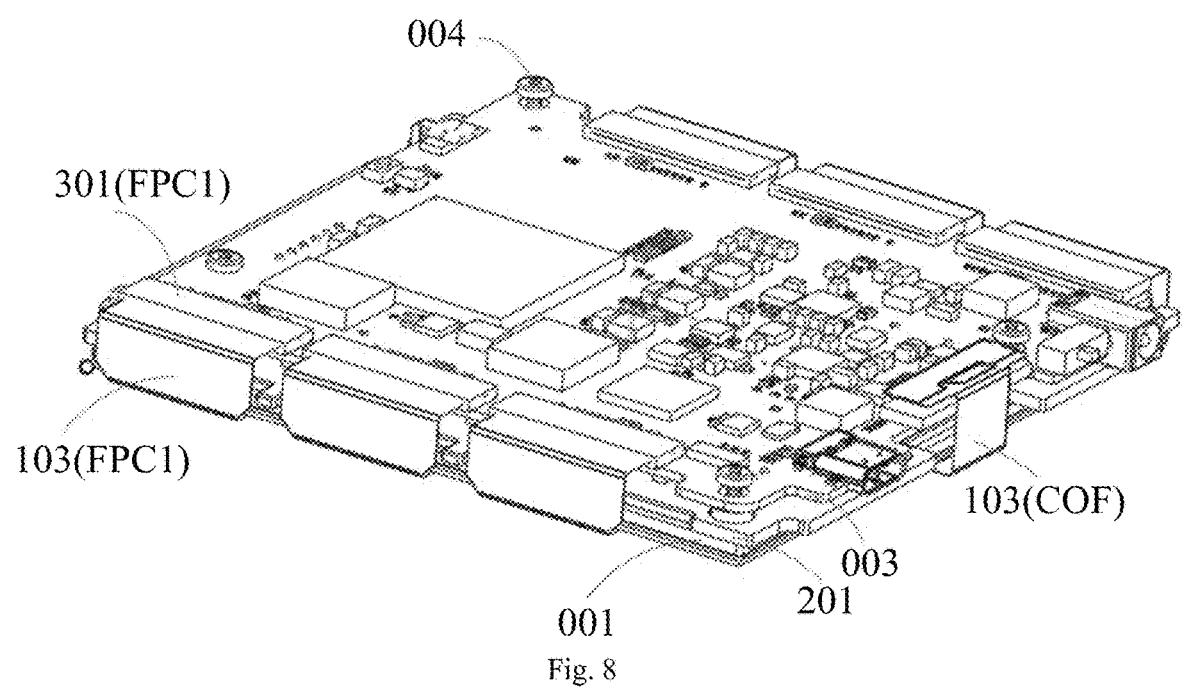
FIG. 8 is a schematic assembly diagram of a partition plate, a fingerprint identification panel and a main board according to an embodiment of the present disclosure.

In some embodiments, in the fingerprint identification module according to the embodiments of the present disclosure, as shown in FIG. 7, the main board 003 further includes a universal serial bus (USB) interface 303, a switch 304 and a power socket 305 that are arranged on the same side (for example, a side adjacent to the chip on film COF). The switch 304 is arranged adjacent to the power socket 305. It is certain that in some embodiments, the main board 003 may further include other interfaces known to those skilled in the art, and relative positions of the USB interface 303, the switch 304 and the power socket 305 are not particularly defined.

In some embodiments, in the fingerprint identification module according to the embodiments of the present disclosure, as shown in FIG. 4 and FIGS. 7-10, the side wall 2022 adjacent to the USB interface 303, the switch 304 and the power socket 305 is provided with a first opening 20221 and a second opening 20222. The first opening 20221 exposes the USB interface 303 and the second opening 20222 exposes the switch 304 and the power socket 305. In this way, a key function region on the front (i.e. the side used for fingerprint identification) of the fingerprint identification module may be omitted, thereby reducing the size of the frame and a front area of the whole fingerprint identification module.

Figure 2:
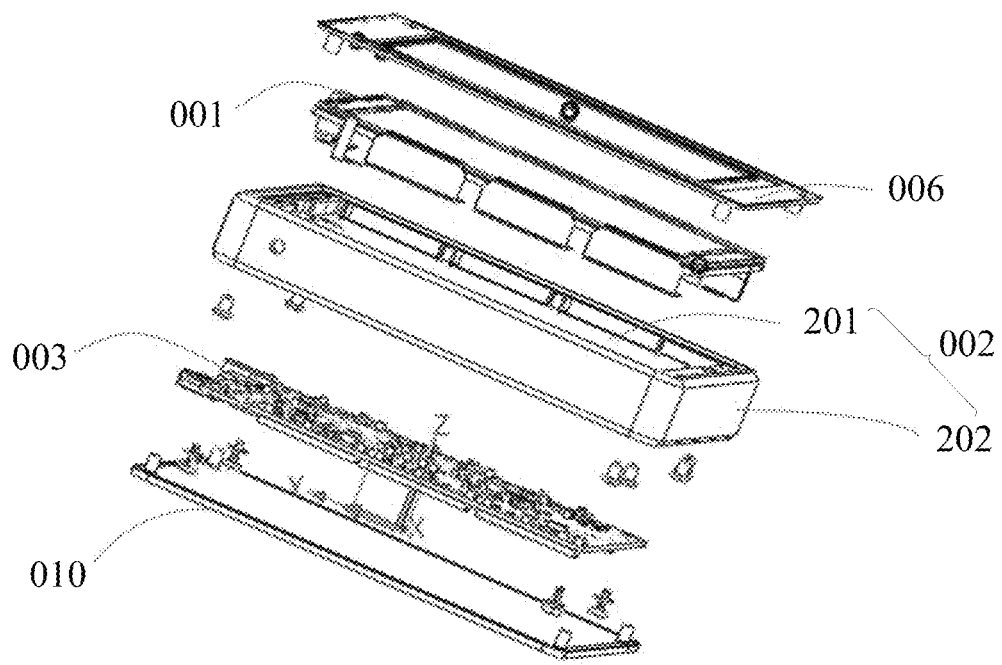
FIG. 2 is an exploded solid diagram of a fingerprint identification module according to an embodiment of the present disclosure.
Figure 11:
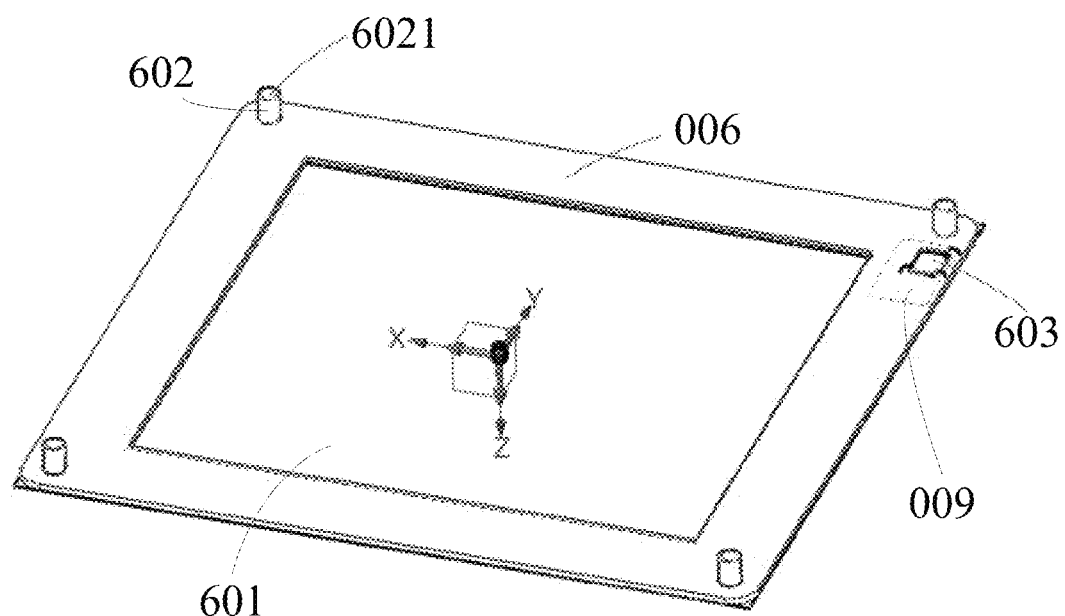
FIG. 11 is a schematic structural diagram of a front cover according to an embodiment of the present disclosure.
Figure 12:
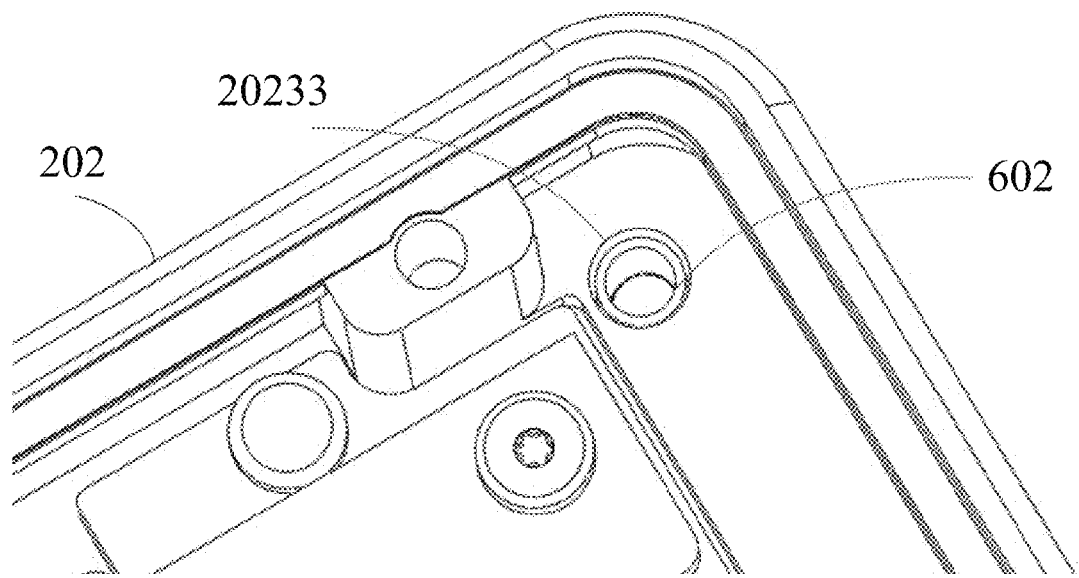
FIG. 12 is a schematic assembly diagram of a front cover and a middle frame according to an embodiment of the present disclosure.

In some embodiments, as shown in FIGS. 2, 11 and 12, the fingerprint identification module according to the embodiments of the present disclosure further includes a front cover 006. The front cover 006 is positioned at a side, adjacent to the fingerprint identification panel 001, of the middle frame 202. The front cover 006 is fixedly connected to the middle frame 202. In order to make fingers directly contact with the fingerprint identification panel 001 for improving sensitivity of fingerprint identification, the front cover 006 may be provided with a third opening 601. An orthographic projection, on the fingerprint identification panel 001, of the third opening 601 is caused to substantially coincide with the fingerprint identification region AA. It should be noted that in the embodiments according to the present disclosure, due to the limitation of process conditions or influence of other factors such as measurement, "substantially coincide" may mean perfect coincidence, or a certain deviation (for example, with a deviation of ±2 μm). Therefore, a relation of "substantially coincide" between related features shall fall within the protection scope of the present disclosure as long as error permission is satisfied.

In some embodiments, as shown in FIGS. 4, 9, 11 and 12, the fingerprint identification module according to the embodiments of the present disclosure further includes third connectors 007. At least partial flanges 2023 (for example, a flange 2023 adjacent to a first flexible printed circuit board FPC1) includes fourth via holes 20233. The fourth via holes 20233 are positioned at two edges (or called two ends) in the extension direction of the flange 2023. The front cover 006 includes second connection posts 602. The second connection post 602 is positioned at a side, facing the flange 2023, of the front cover 006. The second connection post 602 includes a third blind hole 6021. The second connection post 602 is embedded in the fourth via hole 20233, and the third connector 007 is embedded in the third blind hole 6021. During implementations, the second connection post 602 may be placed in the fourth via hole 20233, and the third connector 007 may be screwed into the third blind hole 6021. In the process of screwing the third connector 007 into the third blind hole 6021, the front cover 006 gradually approaches the middle frame 202 and presses the fingerprint identification panel 001 against the partition plate 201. After the step of assembly, a combination of fingerprint identification panel 001 and the main board 003 may not slide relative to the partition plate 201 anymore. It should be understood that in order to press the fingerprint identification panel 001 against the partition plate 201 by the front cover 006, as shown in FIG. 12, an end face of the second connection post 602 should be lower than an end face of the fourth via hole 20233 after the step of assembly, that is, the third connector 007 may not penetrate the fourth via hole 20233.

In addition, while the third connector 007 is used to fix the front cover 006 and the middle frame 202, fixation among a combination of the front cover 006, the fingerprint identification panel 001 and the main board 003 is achieved, such that the phenomenon that beauty is affected due to appearance of the third connector 007 on the front (i.e., the side used for fingerprint identification) of the fingerprint identification module is avoided, as shown in FIG. 1. And due to pre-tightening force between the fingerprint identification panel 001 and the partition plate 201, the fingerprint identification module may be more resistant to pressure and less likely to be damaged during use. Optionally, the third connector 007 may be fixing components such as bolts and screws, which are not limited herein.

Figure 13:
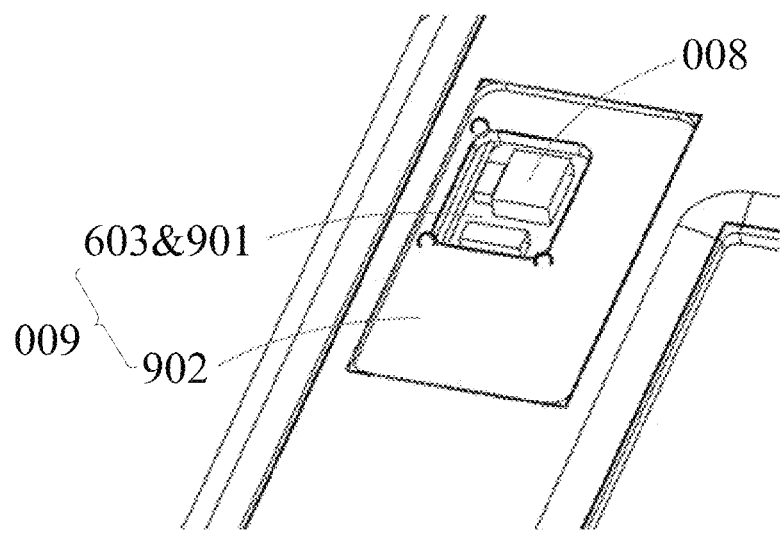
FIG. 13 is a schematic structural diagram of a region where an ambient light sensing element is positioned according to an embodiment of the present disclosure.

In some embodiments, as shown in FIGS. 11 and 13, the fingerprint identification module according to the embodiments of the present disclosure further includes an ambient light sensing element 008. The ambient light sensing element 008 is arranged at a side, far away from the partition plate 201, of the flange 2023. The front cover 006 further includes a fourth opening 603. An orthographic projection, on the fingerprint identification panel 001, of the fourth opening 603 is positioned in the orthographic projection, on the fingerprint identification panel 001, of the flange 2023, such that the fourth opening 603 avoids the fingerprint identification region AA. The fourth opening 603 exposes the ambient light sensing element 008, such that the front cover 006 is prevented from blocking the ambient light sensing element 008, the ambient light sensing element 008 may effectively sense light intensity of ambient environment in a fingerprint identification process conveniently, and fingerprint identification performance is improved.

Figure 14:
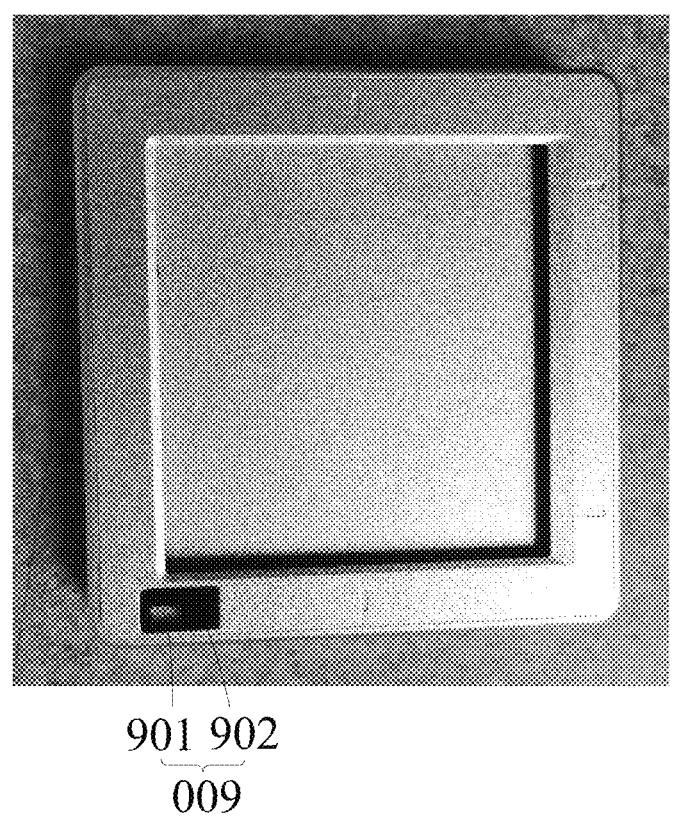
FIG. 14 is a real picture of a fingerprint identification module according to an embodiment of the present disclosure.

In some embodiments, as shown in FIGS. 11, 13 and 14, the fingerprint identification module according to the embodiments of the present disclosure further includes an ambient light protective film 009. The ambient light protective film 009 seals the fourth opening 603. The ambient light protective film 009 includes a transparent region 901. The transparent region 901 is positioned at the fourth opening 603. In this way, the ambient light protective film 009 may be used to block entrance of external dust, etc., and the transparent region 901 of the ambient light protective film 009 guarantees that ambient light may smoothly illuminate the ambient light sensing element 008 at the fourth opening 603.

In some embodiments, in fingerprint identification module according to the embodiments of the present disclosure, as shown in FIGS. 13 and 14, the ambient light protective film 009 further includes a shading region 902. The shading region 902 encircling the transparent region 901. The shading region 902 may absorb ambient light around the transparent region 901, and prevent the phenomenon that the ambient light around the transparent region 901 is reflected on the front cover 006 and illuminates the transparent region 901 and interferes with sensing of the ambient light intensity by the ambient light sensing element 008 accordingly. Optionally, the shading region 902 may be formed by a black screen printing process, such as black ink screen printing.

Figure 15:
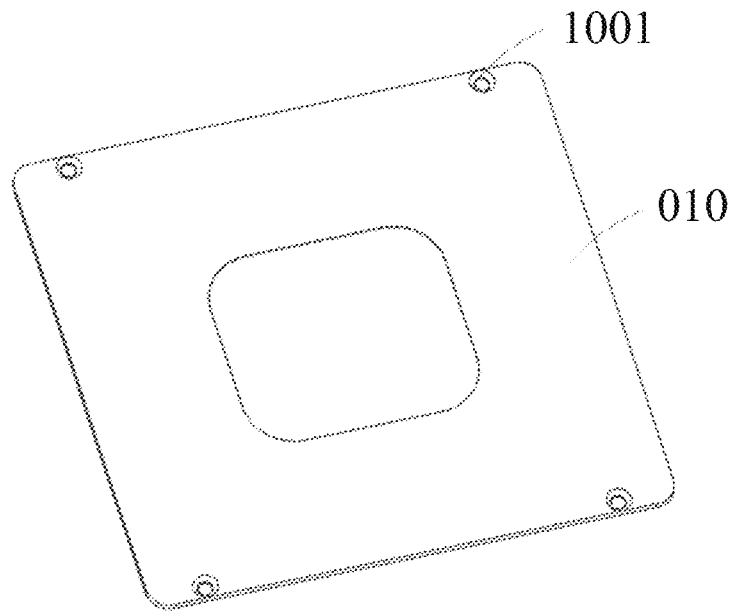
FIG. 15 is a schematic structural diagram of a rear shell according to an embodiment of the present disclosure.
Figure 16:
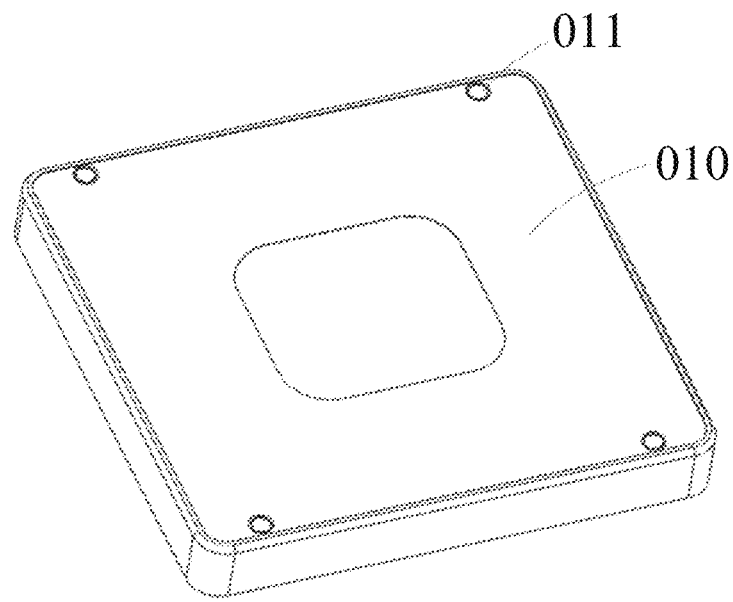
FIG. 16 is a schematic back diagram of a fingerprint identification module according to an embodiment of the present disclosure.

In some embodiments, as shown in FIGS. 2, 15 and 16, the fingerprint identification module according to the embodiments of the present disclosure further includes a rear shell 010. The rear shell 010 is positioned at a side, adjacent to the main board 003, of the middle frame 202. The rear shell 010 is fixedly connected to the middle frame 202, such that the rear shell and the middle frame 202 define a box, and the main board 003 may be protected by the rear shell 010.

In some embodiments, in the fingerprint identification module according to the embodiments of the present disclosure, as shown in FIGS. 4, 15 and 16, to facilitate fixed connection between the rear shell 010 and the middle frame 202, the middle frame 202 further includes a plurality of protrusions 2024. The protrusion 2024 extends from the side wall 2022 toward the accommodation space 2021. The protrusion 2024 is arranged adjacent to a corner of the accommodation space 2021. An orthographic projection, on the fingerprint identification panel 001, of the protrusion 2024 does not overlap the fingerprint identification region AA, and the protrusion 2024 is fixedly connected to the rear shell 010.

In some embodiments, as shown in FIGS. 4, 15 and 16, the fingerprint identification module according to the embodiments of the present disclosure further includes fourth connectors 011. The protrusion 2024 includes a fourth blind hole 20241. The rear shell 010 includes fifth via holes 1001. The fourth connector 011 is embedded in the fourth blind hole 20241 through the fifth via hole 1001. During implementations, the fourth connector 011 penetrates the fifth via hole 1001 and is screwed into the fourth blind hole 20241, such that the rear shell 010 and the middle frame 202 may be fixedly connected. Optionally, the fourth connector 011 may be fixing components such as bolts and screws, which are not limited herein.

It may be seen from the above contents that the fingerprint identification module according to the present disclosure has a small box-shaped structure. The fingerprint identification region occupies the fingerprint identification module in a large proportion, an internal structure is compact, an overall size is small, portability is achieved, an assembly manner is simple and rapid, and disassembly and maintenance are facilitated. Multi-finger fingerprint input and identification may be achieved, a false identification rate is reduced, and security of fingerprint identification is improved.

Based on the same inventive concept, embodiments of the present disclosure further provide an assembly method for the above fingerprint identification module. Since a principle for solving problems of the assembly method is similar to that of the above fingerprint identification module, reference may be made to the embodiments of the above fingerprint identification module for implementation of the assembly method, and repetitions are not repeated herein.

Figure 17:
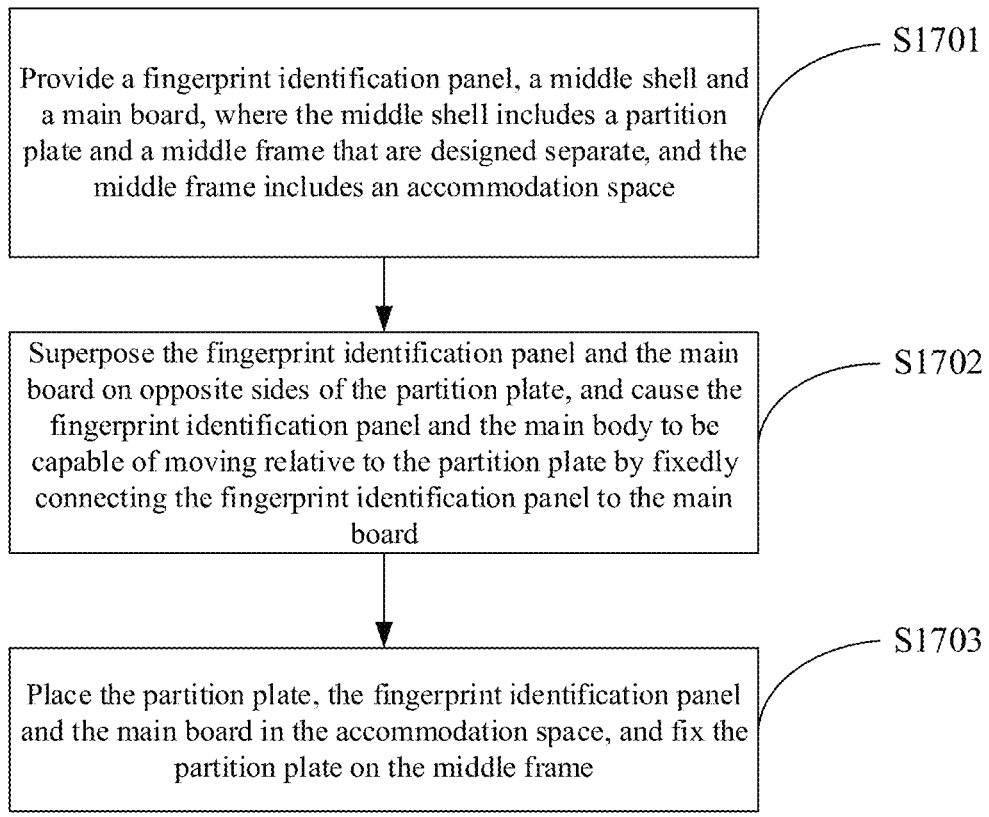
FIG. 17 is a flowchart of an assembly method for a fingerprint identification module according to an embodiment of the present disclosure.

As shown in FIG. 17, the assembly method for the fingerprint identification module according to the embodiments of the present disclosure may include following operations.

S1701, a fingerprint identification panel, a middle shell and a main board are provided. The middle shell includes a partition plate and a middle frame that are designed separate, and the middle frame includes an accommodation space.

S1702, the fingerprint identification panel and the main board are superposed on opposite sides of the partition plate, and the fingerprint identification panel and the main body are caused to be capable of moving relative to the partition plate by fixedly connecting the fingerprint identification panel to the main board.

S1703, the partition plate, the fingerprint identification panel and the main board are placed in the accommodation space, and the partition plate is fixed on the middle frame, and in this case, a combination of the partition plate and the middle frame may still slide up and down relative to a combination of the fingerprint identification panel and the main board.

In some embodiments, in the above assembly method according to the embodiments of the present disclosure, S1702 that the fingerprint identification panel and the main board are superposed on opposite sides of the partition plate, and the fingerprint identification panel and the main body are caused to be capable of moving relative to the partition plate by fixedly connecting the fingerprint identification panel to the main board may be implemented in the following manner:

a first connection post of the fingerprint identification panel is made to penetrate a first via hole of the partition plate; and a first connector is made to penetrate a second via hole of the main board to be embedded in a first blind hole of the first connection post, so that the fingerprint identification panel is fixedly connected to the main board, and the fingerprint identification panel and the main body are caused to be capable of moving relative to the partition plate.

In some embodiments, in the above assembly method according to the embodiments of the present disclosure, the middle frame includes a plurality of side walls and a plurality of flanges, the side walls are connected end to end successively to form the accommodation space, the flange extends from an end face, adjacent to the fingerprint identification panel, of the side wall to the accommodation space, and after S1703 that the partition plate is fixed on the middle frame is executed, the assembly method further includes:

a front cover is provided, and a second connection post of the front cover is inserted into a fourth via hole of the flange; and a third connector is embedded in a third blind hole of the second connection post, so that the front cover and the flange are locked together, and the fingerprint identification panel and the main board are fastened on the opposite sides of the partition plate, and in this case, the combination of the partition plate and the middle frame and the combination of the fingerprint identification panel and the main board are locked.

In some embodiments, in the above assembly method according to the embodiments of the present disclosure, after the operation that a third connector is embedded in a third blind hole of the second connection post, so that the front cover and the flange are locked together, and the fingerprint identification panel and the main board are fastened on the opposite sides of the partition plate is executed, the assembly method further includes:

a rear shell is provided, and a fourth connector is made to penetrate a fifth via hole of the rear shell to be embedded in a fourth blind hole in a protrusion provided in the middle frame, and the rear shell is fastened on the middle frame.

Apparently, a person of ordinary skill in the art can make various modifications and variations to the embodiments of the present disclosure without departing from the spirit and scope of the embodiments of the present disclosure. In this way, if these modifications and variations of the embodiments of the present disclosure fall within the scope of the claims of the present disclosure and their equivalent technologies, the present disclosure is also intended to include these modifications and variations.

What is claimed is:

1. A fingerprint identification module, comprising:
   a fingerprint identification panel comprising a fingerprint identification region;
   a middle shell comprising:
      a partition plate, and
      a middle frame,
      wherein the partition plate is at a side opposite a fingerprint identification side of the fingerprint identification panel, the partition plate is detachably connected to the middle frame, and the middle frame comprises an accommodation space, the accommodation space being internally provided with the partition plate and the fingerprint identification panel; and
   a main board in the accommodation space, the main board being at a side, facing away from the fingerprint identification panel, of the partition plate, and the main board being electrically connected to the fingerprint identification panel.

2. The fingerprint identification module according to claim 1, further comprising:
   a first connector;
   wherein the partition plate comprises a first via hole, the main board comprises a second via hole, the fingerprint identification panel comprises a first connection post, the first connection post is at a side, facing the partition plate, of the fingerprint identification panel, the first connection post comprises a first blind hole, the first connection post passes through the first via hole, and the first connector is embedded in the first blind hole through the second via hole.

3. The fingerprint identification module according to claim 2, wherein the fingerprint identification panel further comprises:
   frame regions encircling the fingerprint identification region,
   wherein a plurality of first connection posts are arranged, and the first connection posts are dispersedly arranged in the frame regions.

4. The fingerprint identification module according to claim 1, wherein the middle frame comprises:
   a plurality of side walls; and
   a plurality of flanges;
   wherein the side walls are arranged at a side, facing the fingerprint identification panel, of the partition plate, are arranged on a periphery of the partition plate, and extend in a direction perpendicular to a surface of the partition plate, a quantity of the side walls matches a quantity of edges of the partition plate, the side walls are connected end to end successively in a direction parallel to the surface of the partition plate to form the accommodation space, each flange is detachably connected to the partition plate, the flange extends from an end face, adjacent to the fingerprint identification panel, of the side wall to the accommodation space, and an orthographic projection, on the fingerprint identification panel, of each flange does not overlap the fingerprint identification region.

5. The fingerprint identification module according to claim 4, wherein an edge of the partition plate comprises a first recess, the first recess being recessed in a direction far away from the edge of the partition plate in a direction parallel to the surface of the partition plate;
the flange comprises a second recess, the second recess being recessed toward the side wall in the direction parallel to the surface of the partition plate;
the first recess and the second recess are provided in a through manner in a stacking direction of the partition plate and the flange, and the fingerprint identification panel is electrically connected to the main board through the first recess and the second recess that are provided in the through manner.

6. The fingerprint identification module according to claim 5, wherein the fingerprint identification panel comprises:
a backlight module,
a fingerprint identification substrate, and
a drive circuit,
wherein the drive circuit is connected to the backlight module and the main board as well as the fingerprint identification substrate and the main board through the first recess and the second recess that are provided in the through manner, and the backlight module is positioned between the fingerprint identification substrate and the partition plate in a direction perpendicular to the surface of the partition plate.

7. The fingerprint identification module according to claim 4, further comprising:
second connectors,
wherein the flange comprises second blind holes, the second blind holes being at two edges in an extension direction of the flange;
the partition plate comprises third via holes directly facing the second blind holes; and
the second connectors are embedded in the second blind holes through the third via holes.

8. The fingerprint identification module according to claim 4, wherein the main board further comprises:
a universal serial bus (USB) interface, a switch and a power socket that are arranged on a same side;
wherein the switch is arranged adjacent to the power socket.

9. The fingerprint identification module according to claim 8, wherein the side wall adjacent to the USB interface, the switch and the power socket is provided with a first opening and a second opening, the first opening exposing the USB interface and the second opening exposing the switch and the power socket.

10. The fingerprint identification module according to claim 4, further comprising:
a front cover,
wherein the front cover is at a side, adjacent to the fingerprint identification panel, of the middle frame, the front cover is fixedly connected to the flanges, the front cover comprises a third opening, and an orthographic projection, on the fingerprint identification panel, of the third opening substantially coincides with the fingerprint identification region.

11. The fingerprint identification module according to claim 10, further comprising:
third connectors,
wherein the flange comprises fourth via holes, the fourth via holes being at two edges in an extension direction of the flange;
the front cover comprises second connection posts, the second connection posts being at a side, facing the flanges, of the front cover, and the second connection posts comprising third blind holes;
the second connection posts are embedded in the fourth via holes, and the third connectors are embedded in the third blind holes.

12. The fingerprint identification module according to claim 10, further comprising:
an ambient light sensing element,
wherein the ambient light sensing element is arranged at a side, far away from the partition plate, of the flange; and
the front cover further comprises a fourth opening, an orthographic projection, on the fingerprint identification panel, of the fourth opening is in the orthographic projection, on the fingerprint identification panel, of the flange, and the fourth opening exposes the ambient light sensing element.

13. The fingerprint identification module according to claim 12, further comprising:
an ambient light protective film,
wherein the ambient light protective film seals the fourth opening, and the ambient light protective film comprises a transparent region, the transparent region being at the fourth opening.

14. The fingerprint identification module according to claim 13, wherein the ambient light protective film further comprises a shading region, the shading region encircling the transparent region.

15. The fingerprint identification module according to claim 4, further comprising:
a rear shell,
wherein the rear shell is at a side, adjacent to the main board, of the middle frame, and the rear shell is fixedly connected to the middle frame.

16. The fingerprint identification module according to claim 15, wherein the middle frame further comprises:
a plurality of protrusions,
wherein the protrusion extends from the side wall to the accommodation space, the protrusion is arranged adjacent to a corner of the accommodation space, an orthographic projection, on the fingerprint identification panel, of the protrusion does not overlap the fingerprint identification region, and the protrusion is fixedly connected to the rear shell.

17. The fingerprint identification module according to claim 16, further comprising:
fourth connectors,
wherein the protrusions comprise fourth blind holes, the rear shell comprises fifth via holes, and the fourth connectors are embedded in the fourth blind holes through the fifth via holes.

18. The fingerprint identification module claim 6, wherein:
the fingerprint identification panel further comprises:

frame regions encircling the fingerprint identification region, wherein the frame regions comprise a first frame region and a second frame region that are opposite each other, and a third frame region and a fourth frame region that are connected to the first frame region and the second frame region respectively; and the drive circuit comprises:

a chip on film, first flexible printed circuit boards, and a second flexible printed circuit board, wherein the chip on film is in the first frame region, the chip on film is folded toward the main board from a side, far away from the backlight module, of the fingerprint identification substrate, and the chip on film is connected to the fingerprint identification substrate and the main board;

the first flexible printed circuit boards are in the third frame region and the fourth frame region, the first flexible printed circuit board is folded toward the main board from the side, far away from the backlight module, of the fingerprint identification substrate, and the first flexible printed circuit board is connected to the fingerprint identification substrate and the main board; and the second flexible printed circuit board is in the second frame region, the second flexible printed circuit board is folded toward the main board from a side, facing the fingerprint identification substrate, of the backlight module, and the second flexible printed circuit board is connected to the backlight module and the fingerprint identification substrate.

\* \* \* \* \*